(12) United States Patent
Hess et al.

(10) Patent No.: US 7,829,997 B2
(45) Date of Patent: Nov. 9, 2010

(54) INTERCONNECT FOR CHIP LEVEL POWER DISTRIBUTION

(75) Inventors: Kevin J. Hess, Addison, TX (US); Chu-Chung Lee, Round Rock, TX (US); James W. Miller, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 701 days.

(21) Appl. No.: 11/732,594

(22) Filed: Apr. 4, 2007

(65) Prior Publication Data

US 2008/0246165 A1 Oct. 9, 2008

(51) Int. Cl.
*H01L 23/52* (2006.01)

(52) U.S. Cl. ............... 257/691; 257/690; 257/777; 257/E23.013; 257/E23.151; 257/E23.153; 257/E23.175

(58) Field of Classification Search ............... 257/688, 257/690, 691, 777, 778, E23.013, E23.014, 257/E23.039, E23.151–E23.153, E23.175
See application file for complete search history.

(56) References Cited

U.S. PATENT DOCUMENTS

| | | | |
|---|---|---|---|
| 5,060,052 A | 10/1991 | Casto et al. | |
| 5,235,207 A | 8/1993 | Ohi et al. | |
| 5,455,200 A | 10/1995 | Bigler | |
| 5,514,912 A | 5/1996 | Ogashiwa | |
| 5,631,191 A | 5/1997 | Durand et al. | |
| 5,719,748 A | 2/1998 | Cullinan et al. | |
| 5,872,403 A | 2/1999 | Bowman et al. | |
| 6,083,772 A | 7/2000 | Bowman et al. | |
| 6,114,751 A | 9/2000 | Kumakura et al. | |
| 6,319,755 B1 * | 11/2001 | Mauri ................ | 438/119 |
| 6,784,525 B2 | 8/2004 | Kuan et al. | |
| 6,836,009 B2 | 12/2004 | Koon et al. | |
| 7,550,318 B2 | 6/2009 | Hess et al. | |
| 2004/0018317 A1 | 1/2004 | Heinrich et al. | |
| 2004/0183174 A1 | 9/2004 | Huang et al. | |
| 2008/0146010 A1 * | 6/2008 | Hosseini et al. ....... | 438/575 |

FOREIGN PATENT DOCUMENTS

| | | |
|---|---|---|
| DE | 4430050 A1 | 2/1996 |
| EP | 0594299 A2 | 4/1994 |
| WO | WO 2005/010989 | 2/2005 |
| WO | 2006020822 A2 | 8/2005 |

* cited by examiner

*Primary Examiner*—Matthew E Warren

(57) ABSTRACT

A semiconductor device (601) is provided which comprises a substrate (603); a semiconductor device (605) disposed on said substrate and having a first major surface; a first metal strap (615) which is in electrical contact with said substrate and which is adapted to provide power to a first region (608) of said semiconductor device; and a second metal strap (616) which is in electrical contact with said substrate and which is adapted to provide ground to a second region (609) of said semiconductor device.

20 Claims, 11 Drawing Sheets

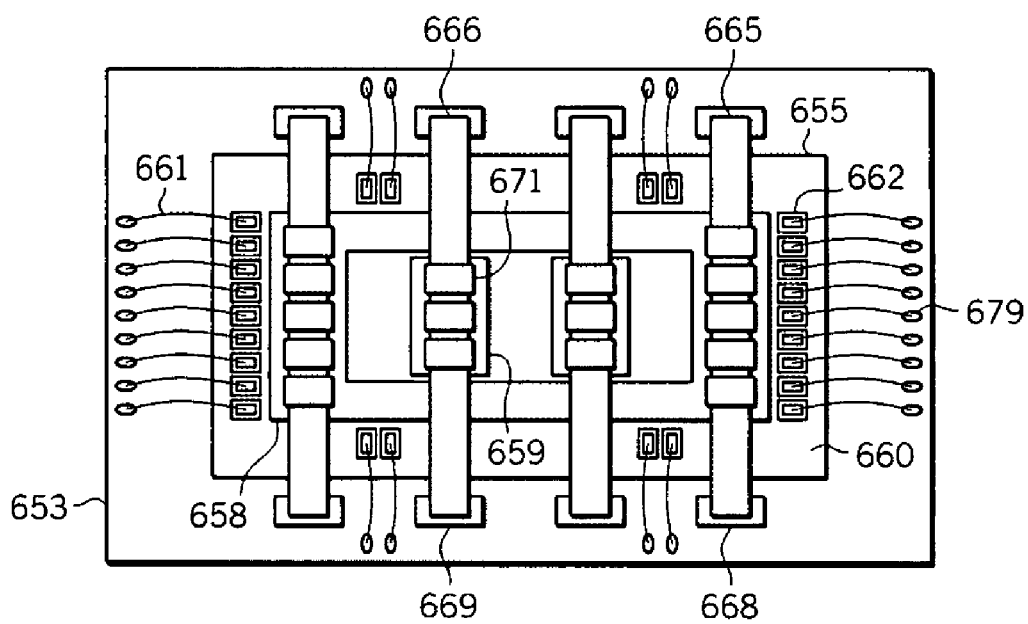
FIG. 11    651
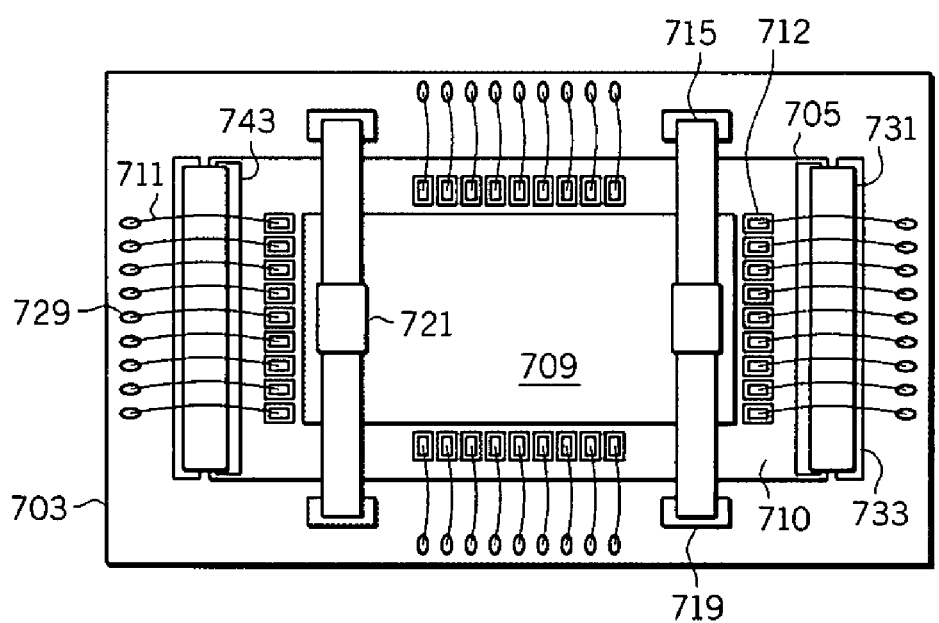
FIG. 12    701

INTERCONNECT FOR CHIP LEVEL POWER DISTRIBUTION

FIELD OF THE DISCLOSURE

The present disclosure relates generally to semiconductor devices, and more particularly to methods for forming electrically conductive pathways between the contacts of a die and those of a substrate in wire bond packaging.

BACKGROUND OF THE DISCLOSURE

In a typical semiconductor fabrication process, integrated circuits are formed on semiconductor substrates using a number of different processing techniques to create the transistors, resistors, capacitors, interconnects, and the various other circuit elements of a semiconductor device. In some processes, portions of the circuit which are designed for a specific functionality are formed separately on a die, and the die is then mounted on a packaging substrate and is used to impart that functionality to a host device. The die circuitry is typically accessed from bond pads formed on the final metal layer of the die. Hence, the bond pads provide a means for the transfer of electrical signals and power from and to the die via bonding wires, conductive bumps, and other elements of the conductive pathway formed between the die and the packaging substrate. The packaging substrate, in turn, provides electrical connections between the die and other circuit elements.

FIG. 1 depicts one example of a conventional wire bond packaged semiconductor device 51. As seen therein, the device 51 comprises a BGA packaging substrate 53 upon which is mounted a semiconductor die 55. A plurality of solder balls 57 are mounted on one face of the packaging substrate 53 to enable connection thereof to a host device. The die 55 is mounted to the opposing face of the packaging substrate 53 by way of a die attach adhesive 59.

The die 55 is equipped with a row of wire-bond pads 61 disposed along an edge 80 of its upper surface. In some implementations, the row of wire bond pads 61 may form a bond pad ring around the perimeter of the upper surface of die 55. The wire-bond pads 61 on the semiconductor die 55 are electrically connected to wire-bond posts 67 on the packaging substrate via bond wires 68. Each individual wire bond pad 61, and its associated wire bond post 67 and bond wire 68, may provide power, ground, or Input/Output (I/O) signal coupling between the die 55 and the packaging substrate 53. An adhesive fillet 76 is provided to further secure the die 55 to the packaging substrate 53. In some cases, the adhesive fillet 76 may be formed of the same material as the die attach adhesive 59. Though not shown, a molding material may be applied to complete the structure. The molding material will typically encapsulate the die and bond wires.

It will be appreciated from the foregoing that a device of the type depicted in FIG. 1 will have many signal bond pads, and will also have many power and ground wires connected to bond pads of those types. In particular, the device 51 shown therein is equipped with several bond wires 68 that contact bond pads 61 around the periphery of the die 55. An I/O cell is associated with each bond pad 61. In a typical implementation of such a device, there will also be bond pads associated with power and ground cells that form a ring around the outer perimeter of the die. Hence, there will be bond wires connecting bond posts 67 in the packaged substrate 53 to all of those pad types.

BRIEF DESCRIPTION OF THE DRAWINGS

FIG. 11 is an illustration of an embodiment of an interconnect design in accordance with the teachings herein;
FIG. 12 is an illustration of an embodiment of an interconnect design in accordance with the teachings herein.

DETAILED DESCRIPTION

In one aspect, a device is provided herein which comprises (a) a substrate; (b) a semiconductor device disposed on said substrate and having a first major surface equipped with a metal cap layer which extends over a central portion thereof; (c) a first group of bond pads disposed along an edge of said semiconductor device; (d) a first group of wire bonds which are in electrical contact with said substrate and said first group of bond pads; (e) a second group of bond pads disposed along an edge of said semiconductor device; (f) a second group of wire bonds which are in electrical contact with said substrate and said second group of bond pads; and (g) an interconnect which extends between said first and second groups of wire bonds and which is in electrical contact with said substrate and said metal cap layer.

Figure 1:
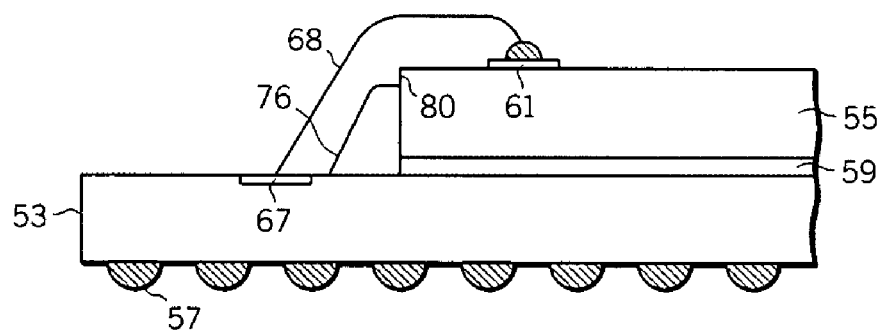
FIG. 1 is an illustration of a prior art method for mounting a semiconductor die on a substrate.

A device of the type depicted in FIG. 1 may be thought of as a two-part structure consisting of an interior core region and a perimeter I/O ring. In operation, the core region of the die performs the functionality for which the die was designed, and the I/O ring receives and transmits the signals provided by the core region of the die to the outside world. A device of this type will typically have separate power and ground bond pads for core and I/O circuitry. Thus, for example, the I/O ring power and ground may have a potential of 2.5 V and may be used to power the output drivers of the device, while the core power and ground may have a potential of 1.2 V and provide power for the low voltage core transistors that perform the interior functional logic of the die.

Although flip chip packaging is typically considerably more expensive than wire bonding, one advantage of flip-chip packaging over wire bonding is that flip chip packaging provides an effective means by which power and ground may be supplied to the core of a die. In particular, in flip-chip packaging, the BGA provides a series of solder joints which are distributed across the center of the die. By contrast, the provision of core power and ground is a more challenging proposition in wire bonded devices.

In particular, power and ground may be provided directly to the I/O ring of a wire bonded device through the placement of a sufficient number of bond pads associated with those functionalities on the perimeter of the device. However, the provision of power and ground to the core region of the device typically requires not only the placement of perimeter bond pads, but also a significant amount of routing. Such routing is typically accomplished through the use of a series of interconnects defined in the interior of the device. In contrast to flip chip packing and the direct access it inherently provides to the core region of a die, the routing schemes necessitated in wire bonding, and the IR drop typically associated with those schemes, contributes to the formation of power starved regions in the core of the die.

In addition, many wire bonded devices are "pad limited". This term refers to situations where the area inside the I/O ring is larger than that of the core region. The area inside the I/O ring is determined by the total signal, power and ground bond pad count required. As a result, the core region of the device will typically contain extra non-functional space, called "white space", which makes the device larger than would be the case if the device were not pad limited.

In light of the foregoing issues, the number of bond pads that can be placed around the perimeter of a die are typically subject to severe constraints. Since signal pads, as part of the functional logic of the device, typically cannot be eliminated from a device, this usually means that some of the power and ground pads must be eliminated from the perimeter of the die. As a result, it becomes increasingly more challenging to route sufficient power (Vdd) and ground (Vss) to the core region of the die, particularly for devices with demanding core power requirements.

There is thus a need in the art for a means for providing improved power and ground to core regions of wire bonded devices. Such a means would allow retention of lower cost wire bond packages, rather than higher cost flip-chip packages, while providing effective coupling of the power and ground to the center region of the die.

Some attempts have been made in the prior art to address some of the foregoing issues, and these attempts have resulted in various modifications to conventional wire bond devices of the type depicted in FIG. 1. Some of these modifications are represented by the prior art devices depicted in FIGS. 2-4.

Figure 2:
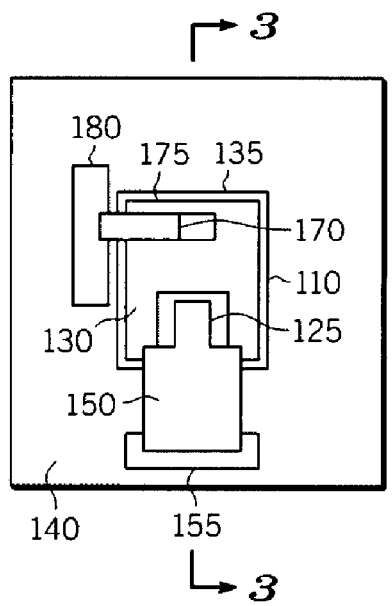
FIG. 2 is an illustration of a prior art method for mounting a semiconductor die on a substrate.
Figure 3:
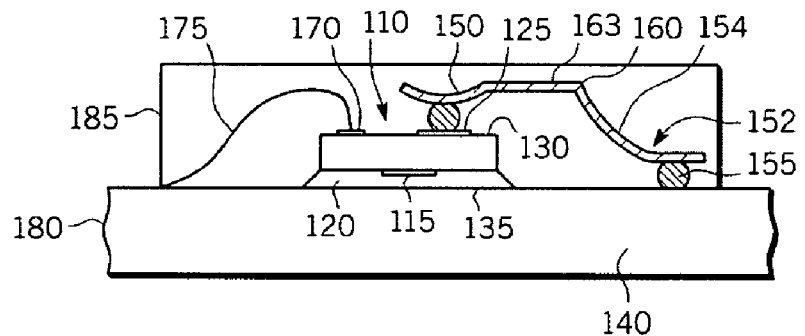
FIG. 3 is an illustration of a prior art method for mounting a semiconductor die on a substrate.

With reference to FIGS. 2-3, a package 101 for a power semiconductor die 110 is shown therein. FIG. 2 illustrates a side view of the package 101, and FIG. 3 illustrates a top view of the package 101. The power semiconductor die 110 has a first power terminal 115 on a first surface 120 of the die 110, and a second power terminal 125 on an opposing second surface 130 of the die 110.

The package 101 includes an electrically conductive, mechanical bond formed between the first surface 120 and a first location 135 on a substrate 140. The mechanical bond electrically couples the first power terminal 115 to the substrate 140. The package 101 also includes an elongated electrically conductive strap 150 that is soldered to the second power terminal 125 and a second location 155 on the substrate 140. The conductive strap 150 comprises an electrically conductive material, and has a lateral bend 160 therein to compensate for thermal expansion of the conductive strap 150 during operation of the die 110. The lateral bend 160 of the conductive strap 150 separates an arcuate section 154 and a substantially straight (flat) section 163 at an approximately normal angle.

The conductive strap 150 is coated with an electrically conductive coating 152 surrounding the material of the conductive strap 150. The power semiconductor die 110 further has a control terminal 170, and a control conductor 175 which electrically couples the control terminal 170 to a third location 180 on the substrate 140. The package 101 also includes an encapsulant 185 surrounding the die 110, the conductive strap 150 and at least a portion of the substrate 140.

Figure 4:
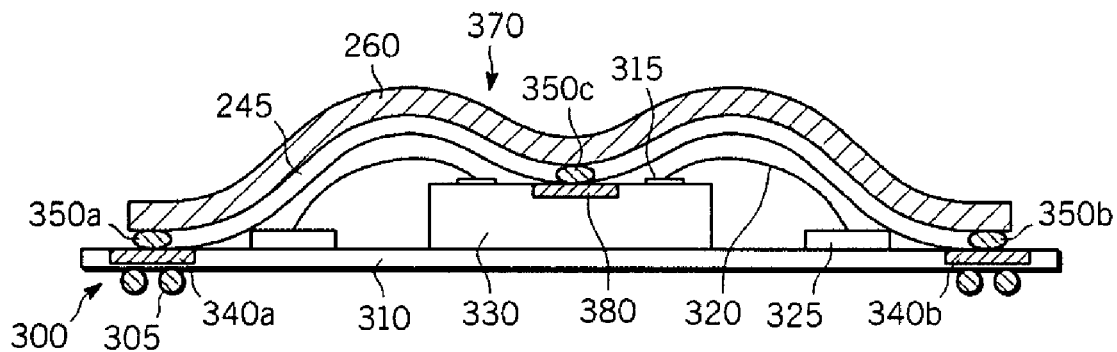
FIG. 4 is an illustration of a prior art method for mounting a semiconductor die on a substrate.

FIG. 4 depicts another semiconductor device 301 which is equipped with a ground arch for wire ball grid arrays. The device has a structure 300 comprising an integrated circuit 330 equipped with a plurality 315 of grounding pads, signal pads, and power pads, and a package 310 for mounting the integrated circuit 330. The device further includes a conductive path having at least one reference trace 340 that surrounds the integrated circuit 330. A grounding arch 370 formed by a dielectric-coated metal tape is disposed over the integrated circuit 330 and is connected to its ground pad in order to provide heat dissipation and EMI shielding. The metal tape comprises a conductive material 260 coated with a dielectric material 245. The metal tape is connected to ground traces 340a and 340b, and to grounding region 380, with respective conductive bonds 350a, 350b and 350c.

While the aforementioned prior art devices may address some of the issues associated with a wire bonded device such as that shown in FIG. 1, these devices, and the methods inherent in their manufacture, fail to address all of the aforementioned issues, and in addition, create further issues of their own.

In particular, while some of these devices feature the use of metal straps to connect the die pads to the package substrate or leadframe, the metal straps are attached to the pads and frame by reflowed solder which is deposited by screen-printing or stud bumping processes. Hence, such an approach requires that the die is reflowed prior to encapsulation. The use of solder reflow to attach the metal straps transfers the reflow stresses to the die pads and the structures below them. In backend stacks with low dielectric constant (low-k) and ultra low-k interlevel dielectrics (ILDs), the transfer of reflow stresses from the pads to the stack frequently causes delamination of the backend. For standard BGA (ball grid array) packages, this adds an extra step and additional thermal budget to the die.

Moreover, it is typically a requirement for most end use applications that the packaged die has as low a profile as possible. This is because many end use devices require stacking of packaged die to impart all of the desired functionality to the device, but are themselves subject to significant size constraints. For example, cell phones or personal digital assistants (PDAs) incorporating packaged die are typically required to be as slim as possible to facilitate handling.

Other approaches, such as those depicted in FIGS. 2-3, are undesirable in that they either are not intended for use in conjunction with wire bonding, or because the use of these techniques would interfere with the placement of wire bonds around the perimeter of the die, thereby failing to mitigate, and indeed contributing to, bond wire crowding.

It has now been found that the aforementioned needs in the art may be met through the provision, in a wire bonded packaged die, of a (preferably low profile) metal strap or other metal interconnect which may be added to the die to augment the wire bonds. The interconnect preferably has a first end, and more preferably first and second ends, which are preferably attached to the package substrate by means of a conductive adhesive. The use of multiple contact points provides additional mechanical stability for the metal strap, particularly during the subsequent over-molding process. As result, a low profile metal strap can be used. By contrast, the device described in FIG. 4 herein has one connection to the package substrate, and this connection is made by the solder joint which may not be strong enough to sustain the force generated during over-molding process if the metal strap has low profile.

With respect to preferred embodiments of the present disclosure, an intermediate portion of the interconnect is equipped with one or more depressions (frequently referred to herein as "gull wing" structures, due to their profile in the preferred embodiment), the lowest portions of which are used to create connections to the die. These connections, which are preferably achieved with a conductive adhesive, may be formed to a die pad or to a metal cap (MCAP) layer.

The use of a conductive adhesive in attaching the interconnect to the packaging substrate and the die is advantageous in that it is fully compatible with subsequent encapsulation and post mold curing processes. Moreover, the use of such adhesives eliminates the application of reflow stresses to the die pads, can be effected at lower temperatures compared to solder reflow, and can reduce the thermal impact to the die, all of which are important advantages for advanced device packaging.

The use of metal straps or other interconnects of the type disclosed herein to provide power (Vdd) directly into the core or center of a die has many advantages. In a conventional package level interconnect, the bonding pads which enable the die to communicate to the BGA substrate and motherboard via wire bonds are placed around the perimeter of the die. Hence, routing is required in order for the core of the die to get the power it requires. Unfortunately, IR drop increases with routing and, in conventional packaged die, results in significant loss of potential. Routing also reduces the speed of the die, since the speed of the die core is ultimately proportional to the voltage supplied to it.

The metal interconnects disclosed herein overcome this problem by supplying power (Vdd) directly into the core of a die. These interconnects may be attached to the core of a die with a conductive adhesive and/or bond pad, and may be attached to the BGA substrate on the ends. While thickness of conventional wire bond is 1 mil or less, these interconnects may be made with thicknesses of 10 microns or greater, and may be constructed of copper or other highly conductive metals. Hence, the use of these interconnects can significantly reduce the electrical and thermal resistivities associated with conventional wire bonds.

Moreover, because the use of these interconnects minimizes routing in the thinner interconnect layer on the die, IR drop is significantly reduced. Hence, a die utilizing such an interconnect may run cooler and require less thermal management for the same speed as compared to a conventional wire bonded die. Also, Vdd die pads at the perimeter of the die may be eliminated. Since, as noted above, the number of die pads required at the perimeter of the die is frequently the limiting factor in device size reduction, elimination of Vdd pads from the perimeter of the die may reduce overall die size in many applications.

With reference to FIGS. 5-8, a first particular, non-limiting embodiment of a package level interconnect design is depicted. The package 401 shown therein comprises a BGA substrate 403 having a die 405 disposed on a first major surface thereof, and a ball grid array (BGA) 407 disposed on a second major surface thereof. The die 405 is attached to the BGA substrate by means of adhesive 414. An adhesive fillet 413 is disposed at the interface of the die edge and the package substrate. The die 405 has an aluminum capping layer 409 on its surface about which is disposed an input/output (I/O) ring 410.

Figure 5:
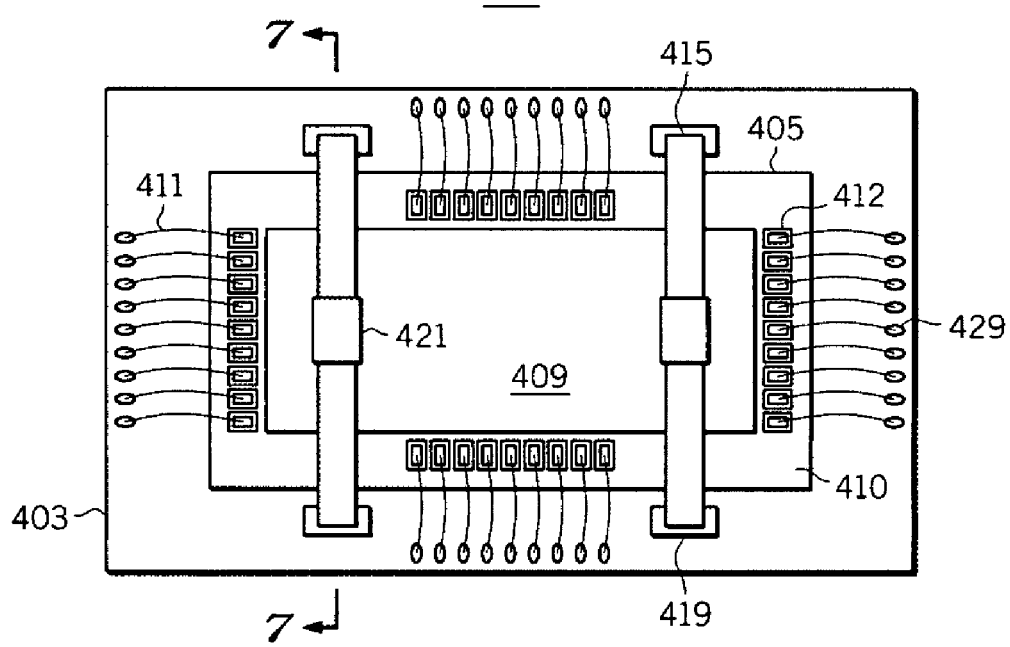
FIG. 5 is an illustration of an embodiment of an interconnect design in accordance with the teachings herein.
Figure 6:
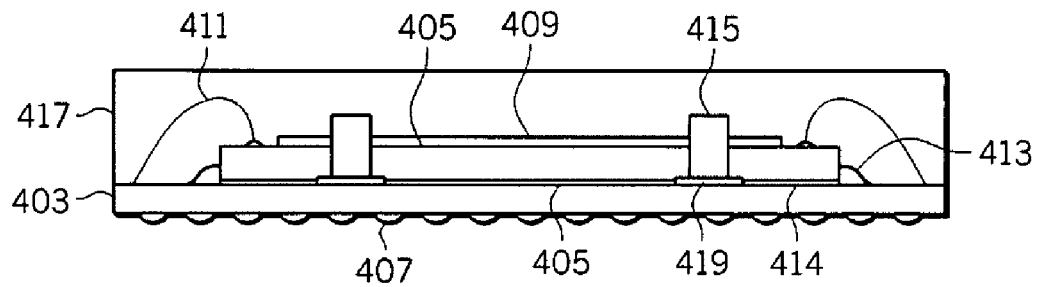
FIG. 6 is a side view of FIG. 5.

The package is equipped with a series of wire bonds 411 which are connected to a series of peripheral bond pads 412 disposed in the I/O ring 410. For clarity, some of the wire bonds 411 of FIG. 5 are not shown in side view of the embodiment in FIG. 6. The wire bonds 411 are connected to wire bond posts 429 disposed on the first major surface of the BGA substrate 403 to establish electrical connection between the die and the package substrate. Electrical connection between the wire bond posts of the package substrate and the package contacts of the BGA 407 is established by conductive wiring layers contained within the BGA substrate 403 which are not shown.

The package 401 is further equipped with a plurality of interconnects 415. Although the package is depicted with two such interconnects 415, one skilled in the art will appreciate that the number of interconnects in the package may vary from one application to another. The interconnect 415 is connected to the core region of the die 409 by way of a gull wing structure 421.

The gull wing structure may directly contact the aluminum capping layer 409, or may contact a bond pad disposed on the surface thereof. The terminal ends of each interconnect 415 are likewise electrically connected to bond pads 419 defined in the BGA substrate 403. The electrical connections between the gull wing structure 421 and aluminum capping layer 409 (or bond pad disposed thereon), and between the interconnect 415 and the bond pads 419 defined in the BGA substrate 403, are preferably formed through the use of a conductive adhesive, but may also be formed through the use of a solder paste, through the formation of a solder joint, or by other suitable means of forming electrical connections as are known to the art.

The bond pads 419 defined in the BGA substrate 403 are preferably exposed copper pads. The surfaces of these pads are preferably plated with Ni—Au, since bare copper is subject to oxidation. In some embodiments, the portion of the interconnect 415 which contacts the bond pad 419 may be widened to provide greater surface area for connection. The dimensions of the bond pads 419 will typically be larger than the dimensions of the terminal ends of the interconnect 415, and will usually be selected to establish suitable manufacturing tolerances for misalignment between the two surfaces.

Figure 7:
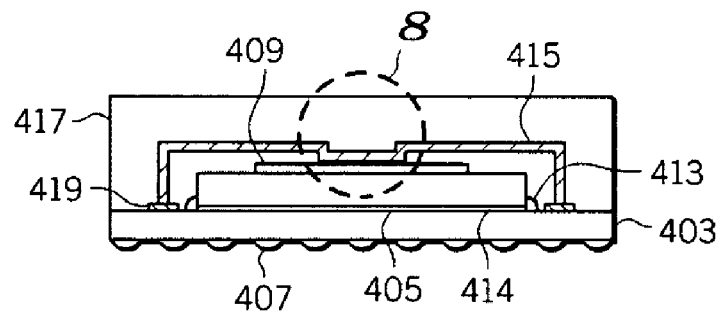
FIG. 7 is a cross-sectional illustration taken along LINE 7-7 of FIG. 5.
Figure 8:
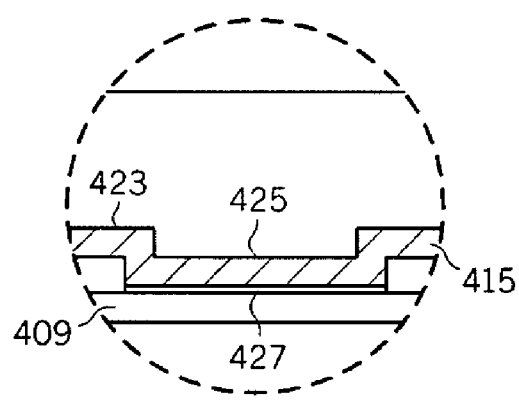
FIG. 8 is a magnified view of region 421 of FIG. 7.

FIGS. 7-8 depict the gull wing structure 421 of the interconnect in greater detail. As seen therein, the gull wing structure 421 comprises lateral portions 423 and an indented central portion 425 which is attached (preferably through the use of a conductive adhesive) to a bond pad 427 provided on the surface of the aluminum capping layer 409.

In some embodiments of the gull wing structure depicted in FIGS. 7-8, the indented central portion 425 is attached directly to the aluminum capping layer 409 (preferably through the use of a conductive adhesive). While the gull wing structure 421 depicted in FIGS. 7-8 is more or less U-shaped, it will be appreciated that various other profiles are possible for this portion of the interconnect 415 in accordance with the teachings herein. Thus, for example, this portion of the interconnect 415 may contain one or more V-shaped structures. Preferably, whatever the profile, the structure provides sufficient separation between the interconnect 415 and the aluminum capping layer 409. The indented portion thereof preferably also provides sufficient surface area for attachment between the interconnect 415 and the aluminum capping layer 409 or bond pad 427 disposed thereon. As seen in FIG. 7, the package 401 is typically set with a suitable encapsulant 417 after all of the wire bonds and interconnects have been formed.

The package 401 depicted in FIGS. 5-8 has a number of notable advantages. First of all, the metal interconnects 415 provided therein supply power (Vdd) directly into the core of a die 405, thereby minimizing routing and the associated IR drop. Consequently, the packaged die 405 may run cooler than conventional wire bond packaged die, and may require comparatively less thermal management for the same die speed. In addition, while the thickness of a conventional wire bond is 1 mil or less, the interconnects 415 described herein may be made with thicknesses of 10 microns or greater, and may be constructed from copper or other highly conductive metals or composite materials. Hence, the use of such interconnects 415 may significantly reduce the electrical and thermal resistivities associated with conventional wire bonds, hence further reducing the thermal management required for the die 405.

Moreover, the design of the package 401 permits the elimination of Vdd bond pads at the perimeter of the die 405. Since, as noted above, the I/O ring 410 is frequently the controlling factor that dictates die size, the elimination of Vdd pads from the I/O ring often has the effect of reducing die size. For die with demanding core power requirements, this design may permit such die to utilize lower cost wire bond packaging rather than higher cost flip-chip packaging, while at the same time providing many of the advantages of flip chip packaging, such as effective coupling of the power and ground to the center region of the die.

Figure 9:
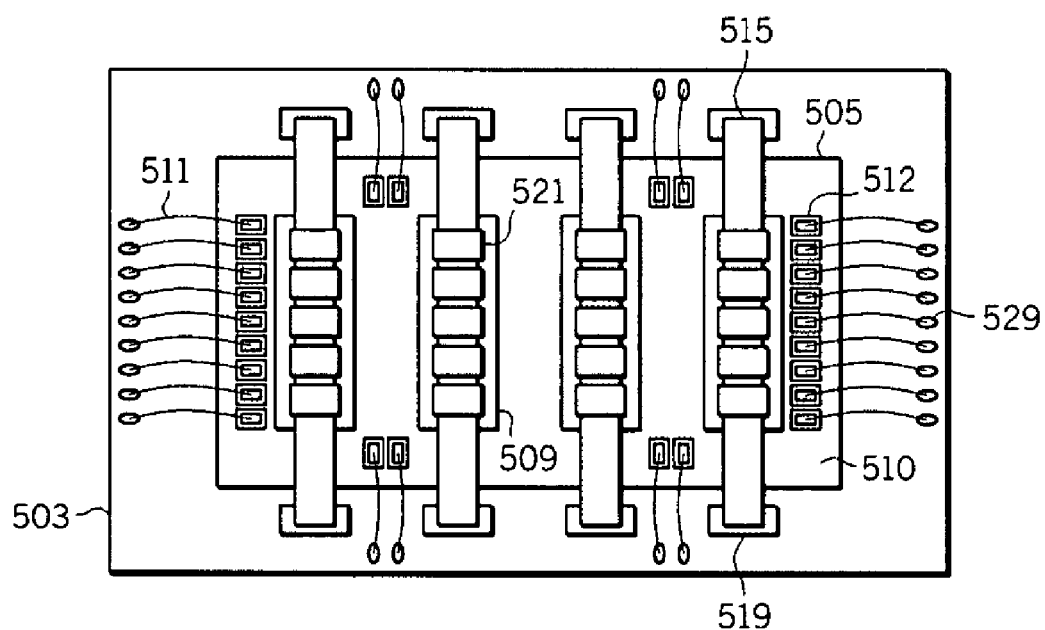
FIG. 9 is an illustration of an embodiment of an interconnect design in accordance with the teachings herein.

FIG. 9 illustrates a second particular, non-limiting embodiment of a package 501 made in accordance with the teachings herein. The package 501 shown therein comprises a BGA substrate 503 having a die 505 disposed on a first major surface thereof, and a ball grid array (BGA) (not shown, but similar to that depicted in FIG. 7) disposed on a second major surface thereof. The die 505 has an aluminum capping layer 509 on its surface which, in this particular embodiment, is divided into four discrete sections, and about which is disposed an input/output (I/O) ring 510. The package is equipped with a series of wire bonds 511 which are connected to a series of peripheral bond pads 512 disposed in the I/O ring 510. The wire bonds 511 are connected to wire bond posts 529 disposed on the first major surface of the BGA substrate 503 to establish electrical connection between the die and the package substrate.

The package 501 is further equipped with a plurality of interconnects 515, the terminal ends of which are electrically connected to bond pads 519 defined in the BGA substrate 503. Each interconnect 515 in the embodiment depicted in FIG. 9 is connected to the core of the die 505 by way of a plurality (five, in this particular embodiment) of gull wing structures 521, each of which contacts the aluminum capping layer 509 or a bond pad disposed on the surface thereof.

One advantage of utilizing multiple interconnects, and multiple gull wing structures 521, is that such an arrangement permits power to be distributed more uniformly across the chip core area. In particular, the Vdd to Vss potential differences are minimized across the entire power grid of the core region of the die when the die is operating at top speed. Also, the use of multiple interconnects 515 and multiple gull wing structures 521 provide useful redundancy in the design of the device in the event that one of the interconnects 515 or gull wing structures 521 fails.

As with the previously described embodiment, the electrical connections between the plurality of gull wing structures 521 and aluminum capping layer 509 (or bond pad thereon), and between the interconnect 515 and the bond pads 519 defined in the BGA substrate 503, are preferably formed through the use of a conductive adhesive. However, it will be appreciated that these electrical connections may also be formed with a solder paste, through the formation of a solder joint, or by other suitable means of forming electrical connections as are known to the art.

As noted above, in the embodiment depicted in FIG. 9, the metal capping layer 509 is divided into four distinct regions, each of which is serviced by a separate interconnect 515. One advantage of such an embodiment is that it permits the use of multiple distinct voltages (up to four in the particular embodiment depicted) to power the transistors in the core of the die 505. Also, while the interconnects 515 in the package 501 depicted in FIG. 9 are described as being used for power (Vdd), it will be appreciated that these interconnects may instead be used for grounding (Vss) the circuitry of the die.

Figure 10:
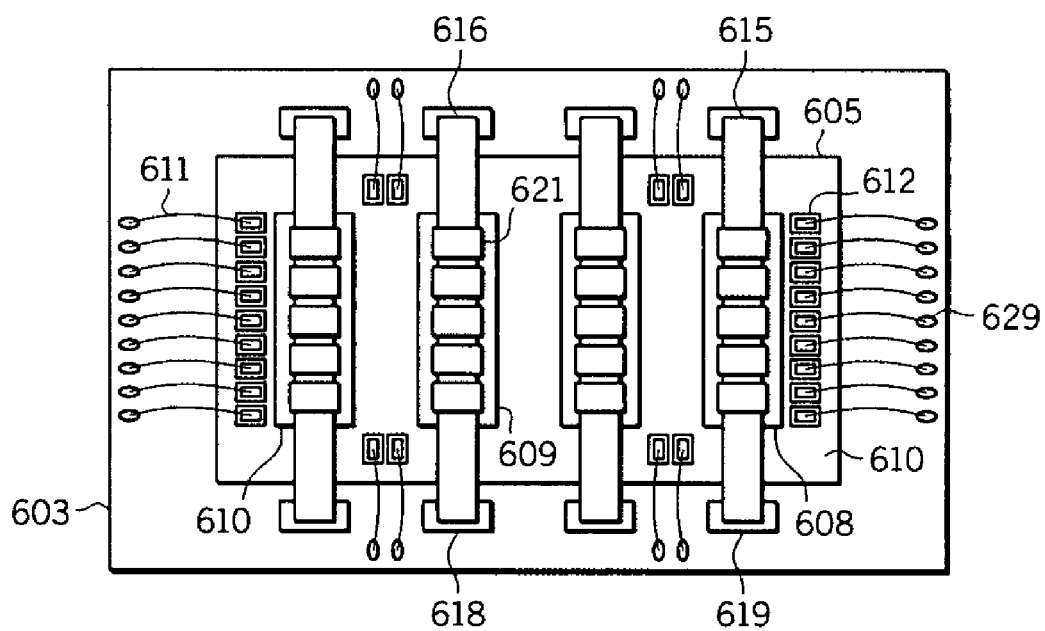
FIG. 10 is an illustration of an embodiment of an interconnect design in accordance with the teachings herein.

FIG. 10 depicts a further particular, non-limiting embodiment of a package 601 in accordance with the teachings herein. The package 601 depicted in FIG. 10 is a hybrid application in which some of the interconnects 615 are used for power (Vdd), while other interconnects 616 are used for grounding (Vss). The Vdd interconnects 615 contact discrete portions of metal cap layer 608 defined within the interior of the die 605, and connect to the bond pads 619 in the BGA substrate. The interconnects 615 may be electrically shorted together with an underlying interconnect defined within the die 605 or BGA substrate 603. Likewise, the Vss interconnects 616 contact discrete portions of a grounding metal cap layer 609 defined within the interior of the die 605 and connect to the bond pads 618 of the BGA substrate.

The interconnects 616 may be shorted together with an underlying interconnect defined within the die 605 or BGA substrate 603. Each of the interconnects 615 and 616 connect to their respective metal cap layers 608 and 609 by means of a plurality of gullwing structures 621. As in the device of FIG. 9, the wire bonds 611 connect the bond pads 612 disposed about the I/O ring 610 of the die 605 to the bond posts 629 of the BGA substrate 603.

The package 651 of FIG. 11 is similar in many respects to the package 601 of FIG. 10. However, FIG. 11 further illustrates the use of a metal cap layer not only as a bond pad for interconnects, but also as an interconnect structure to route power across a broader area of the die. In particular, the package 651 shown therein comprises an outer Vdd metal cap ring 658 which powers the circuitry in the I/O ring via interconnects 665 and a core Vdd metal cap 659 (partitioned into multiple discrete segments) which powers the circuitry in the chip core region via interconnects 666 with different electrical potential. One skilled in the art will appreciate that the discrete segments of the metal cap 659 may be used to route multiple distinct Vdd voltages to the core region of the die 655.

In some embodiments of the package 651 depicted in FIG. 11, the separate segments of the metal cap 659 may be used to route Vdd and Vss to the die core region. Typically, the die 655 will include vias disposed below the metal cap layers 658 and 659 which electrically connect to the interconnect layers of the die 655 to provide the Vdd supplies to the respective core and I/O ring die regions. A plurality of gullwing structures 671 are provided for connecting interconnects 665 and 666 to the corresponding metal cap layers 658 and 659. The interconnects 665 and 666 connect to the respective bond pads 668 and 669 in the BGA substrate. The wire bonds 661 connect the wire bond pads 662 disposed about the I/O ring 660 of the die 655 to the wire bond posts 679 disposed on the BGA package substrate 653.

Figure 13:
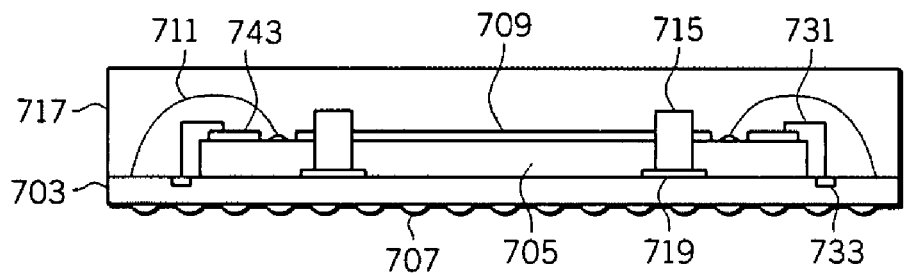
FIG. 13 is an illustration of an embodiment of an interconnect design in accordance with the teachings herein; (a side view of FIG. 12 without showing bond wires coming out of the paper plane)

The package 701 of FIGS. 12-13 is similar in many respects to the package of FIGS. 5-8. Like numbered elements in these figures correspond to like components, and will not be described in further detail (for example, component 711 of FIG. 12 corresponds to component 411 of FIG. 5). However, in the package 701 of FIG. 12-13, the interconnects 715 are used in conjunction with conductive fillets 731 which, in this particular embodiment, are provided along opposing sides of the die 705. The use of such conductive fillets 731 in conjunction with the interconnects 715 has many possible advantages. In particular, the interconnects 715 may be utilized to provide power (Vdd) to the core of the die 705 as described in previous embodiments, and with the advantages attendant thereto, while the conductive fillets 731 may be used for grounding (Vss). Each conductive fillet 731 may comprise solder, but preferably comprises an electrically conductive polymeric material, such as a conductive adhesive or ink. The conductive fillets may be used to electrically couple contact pads or rings 743 on the top surface of the die 705 to contact pads 733 disposed on the BGA substrate 703.

An approach of this type may be used, for example, to create one or more ground paths between peripheral ground points on the top side of the die 705 and one or more substrate ground points. The resulting ganged ground path can be used to replace most or all of the conventional individually created wire bond ground jumper wires that are typically used to connect the individual ground wire-bond pads on a die to a package substrate ground ring or ground bond posts. In some applications, this approach may improve electrical coupling between the die and the substrate, thereby reducing ground bounce and simultaneous switching noise.

Moreover, because this approach can provide die and substrate ground connections that are not wire bonded, it reduces or eliminates the need for dedicated ground wire-bond pads in the die pad ring. For die which are pad limited, this approach may allow for reduced die size. In some applications, this approach will also allow greater flexibility in the layout of the bond pads overlying the I/O circuitry on the die. In addition, some or all of the ground connection bond posts on the substrate may be eliminated and replaced with a narrow contact pad ring adjacent to the die footprint on the substrate. This, in turn, may provide more space for signal pad routing and stagger, helping to reduce cross-talk in high density wire bond designs. Additional benefits may be found in die or package size reductions with the reduction in the size of the ground connections.

Figure 14:
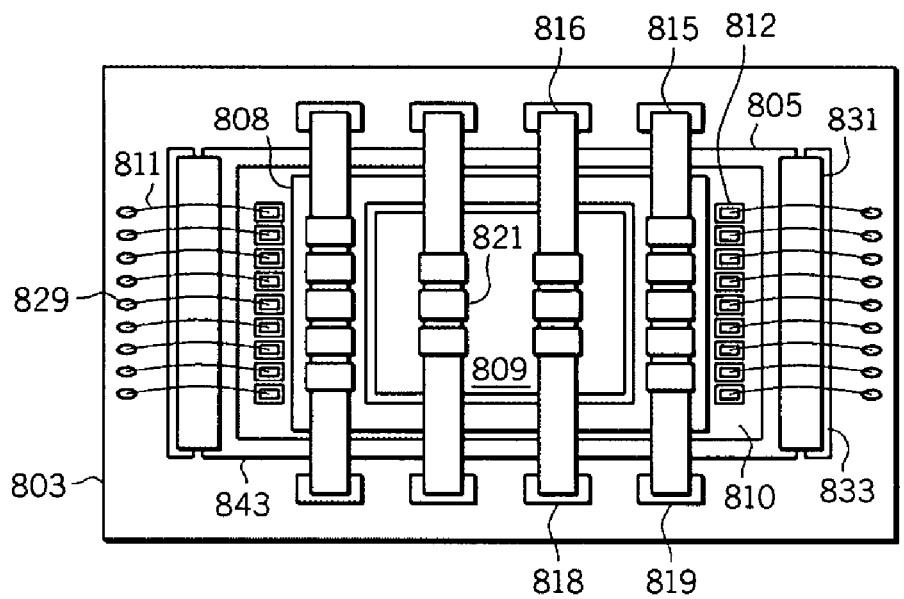
FIG. 14 is an illustration of an embodiment of an interconnect design in accordance with the teachings herein.
Figure 15:
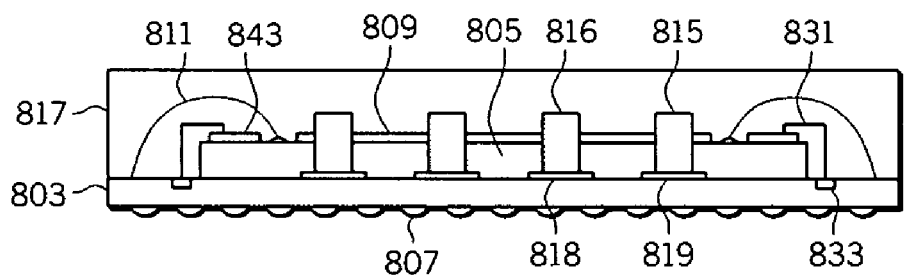
FIG. 15 is a side view of FIG. 14.

FIGS. 14-15 depict a further specific, non-limiting embodiment of a package 801 made in accordance with the teachings herein. The package 801 shown therein comprises a package substrate 803 and die 805 disposed thereon. At the periphery of the die 805 is a Vss metal cap ring 843, an outer Vdd metal cap ring 808 which powers the circuitry in the I/O ring via interconnects 815, a core Vdd metal cap 809 which powers the circuitry in the chip core region via interconnects 816, and a conductive attach interconnect 831 which contacts a bond pad 833 disposed on the BGA substrate 803 and which shares Vss for both power supplies. Each of interconnects 815 and 816 is equipped with a plurality of gull wing structures 821.

Figure 16:
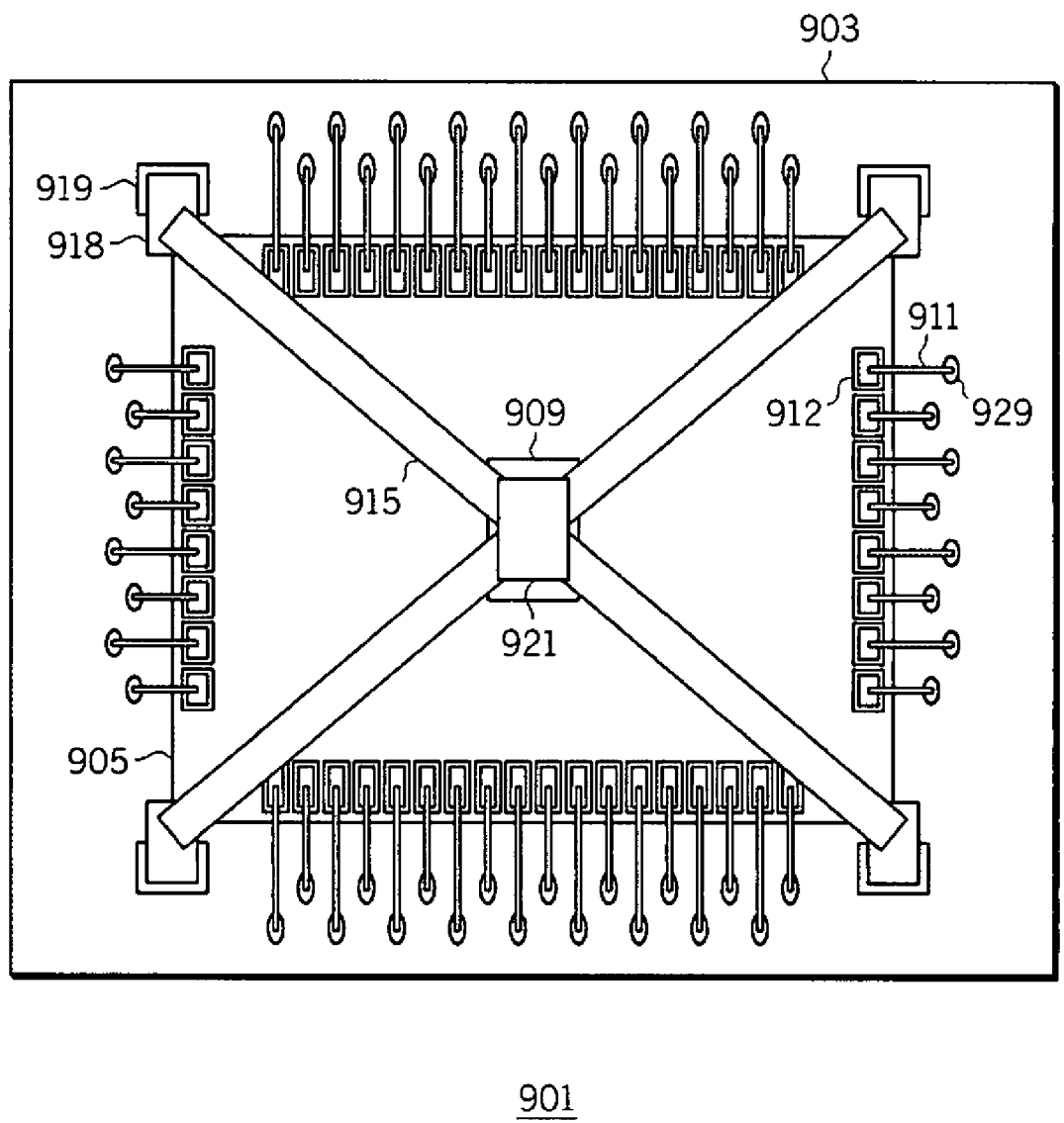
FIG. 16 is an illustration of an embodiment of an interconnect design in accordance with the teachings herein.

FIG. 16 depicts a further particular, non-limiting embodiment of a package 901 in accordance with the teachings herein. The package 901 shown therein is similar in some respects to the package 501 shown in FIG. 9. However, in the package 901 of FIG. 16, the interconnects 915 extend from bases 918 which are in electrical contact with bond pads 919 disposed on the BGA substrate 903 adjacent to the corners of the die 905, and are shorted together via a central gull wing structure 921 disposed in the center of the die 905 which is in electrical contact with the metal cap layer 909. The bases 918 in this particular embodiment attach to the interconnects 915 at a 45° angle, though one skilled in the art will appreciate that bases having various angular connections may be utilized in accordance with the teachings herein.

The package 901 of FIG. 16 is advantageous in that wire bond pads 912 and their associated wire bonds 911 (which connect to associated BGA substrate bond pads 929) are not typically placed in the corners of a die. Consequently, by routing the interconnects 915 through the corners of the die 905 and thereby eliminating the need of Vdd (or Vss pads), the space available for the placement of bond pads around the die perimeter is increased considerably.

Figure 17:
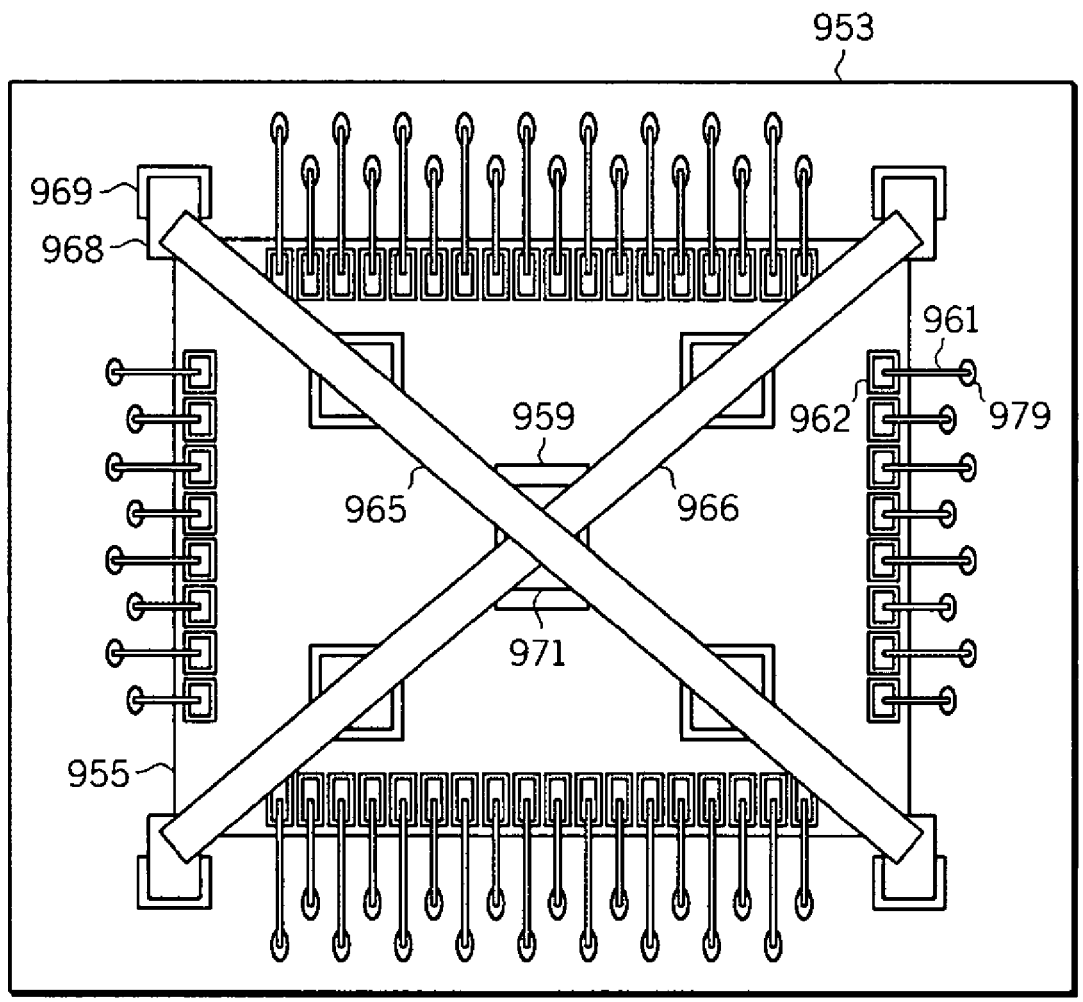
FIG. 17 is an illustration of an embodiment of an interconnect design in accordance with the teachings herein.

FIG. 17 depicts a further particular, non-limiting embodiment of a package in accordance with the teachings herein. The package 951 depicted therein is similar in many respects to the package 901 of FIG. 16. However, the package 951 of FIG. 17 is equipped with first 965 and second 966 interconnects which contact multiple regions of metal cap layer 959 of the die 955 by way of contact structures 971. These contact structures may be, for example, gull wing structures or a pad which is secured to a portion of the first 965 and/or second 966 interconnect by way of a solder or adhesive. The multiple regions of metal cap layer 959 may be electrically isolated or may be shorted together.

A portion of a suitable dielectric material is disposed between the interconnects 965 and 966 in the area where they overlap. Consequently, the interconnects 965 and 966 can carry different potentials. Thus, in some embodiments, one of the interconnects (e.g., interconnect 965) may be used to power the circuitry in the I/O ring of the die 955, and the other interconnect (e.g., interconnect 966) may be used to power the circuitry in the chip core region via a core Vdd metal cap 959.

Figure 18:
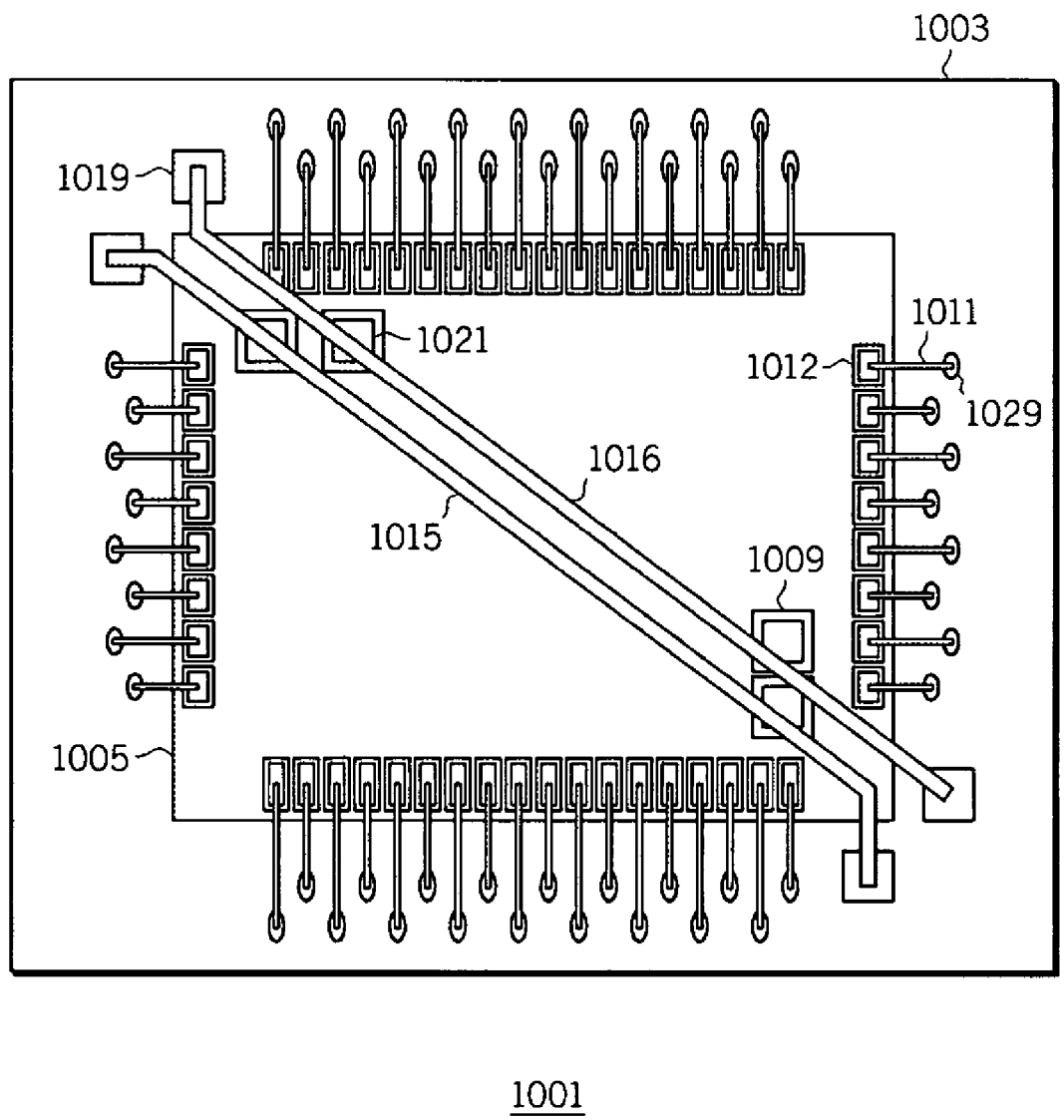
FIG. 18 is an illustration of an embodiment of an interconnect design in accordance with the teachings herein.

FIG. 18 illustrates still another particular, non-limiting embodiment of a package made in accordance with the teachings herein. The package 1001 depicted therein contains first 1015 and second 1016 interconnects having first and second respective potentials associated with them. In the particular embodiment depicted, each of the interconnects 1015 and 1016 is in contact with a portion of a metal capping layer 1009 in the die 1005 via a bond pad 1021. Each of the interconnects is in contact with bond pads 1019 disposed on the BGA substrate 1003.

A package of this type may be advantageous in applications that require the supply of different voltages to different circuits within the die 1005. As with some of the other embodiments described herein, this type of embodiment is also advantageous in that it routes the interconnects 1015 and 1016 through the corners of the die which are typically devoid of bond pads 1012 and bond wires 1011. In some variations of this embodiment, the interior portions of the first and second interconnects may be replaced with a single interconnect which is thus connected to the BGA substrate 1003 through multiple leads.

Figure 19:
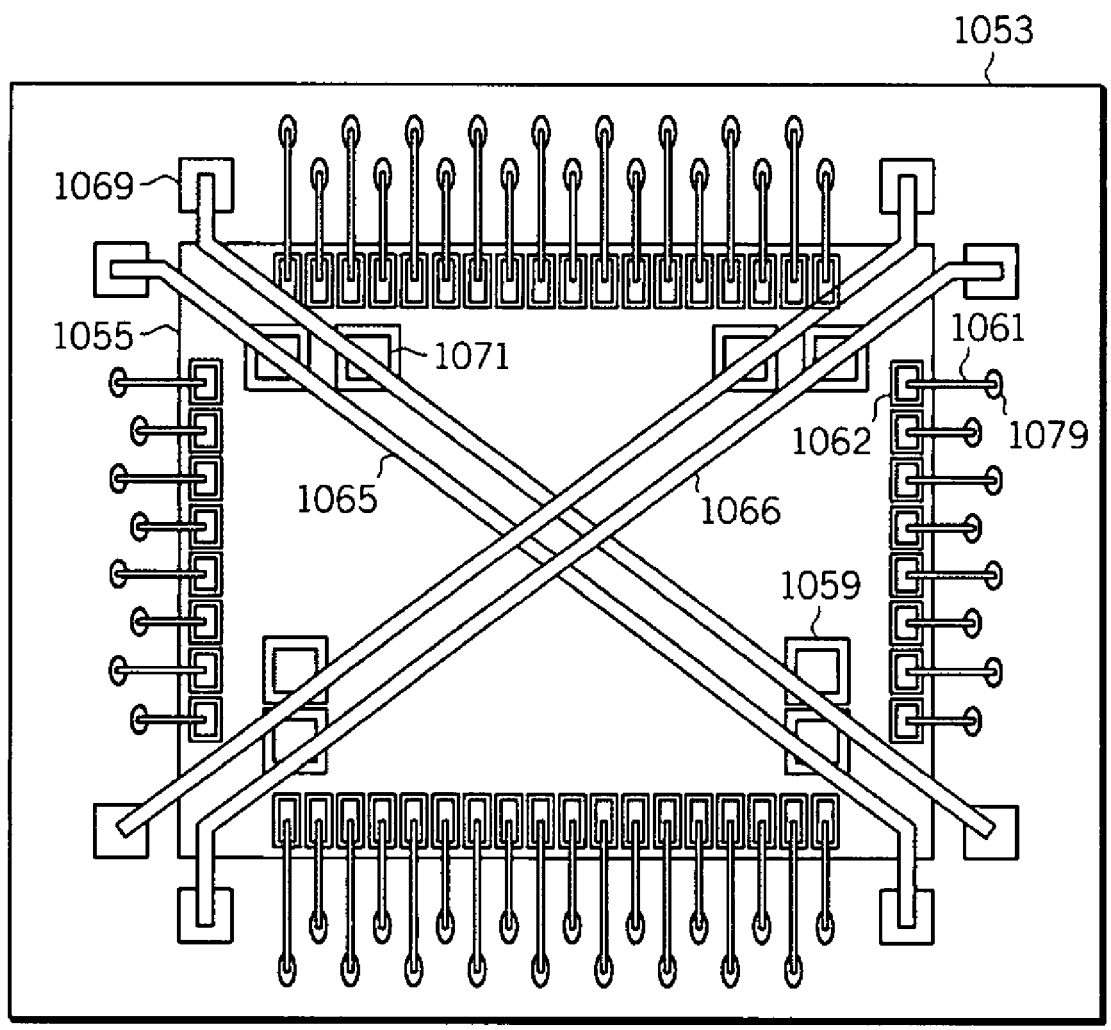
FIG. 19 is an illustration of an embodiment of an interconnect design in accordance with the teachings herein.

FIG. 19 illustrates still another particular, non-limiting embodiment of a package made in accordance with the teachings herein. The package 1051 depicted therein comprises a BGA substrate 1053 upon which is mounted a die 1055. The die 1055 is in electrical communication with the BGA substrate 1053 by way of bond wires 1061 which extend between a first set of contact pads 1062 disposed on the die 1055 and a second set of contact pads 1079 disposed on the BGA substrate 1053.

The package 1051 contains first 1065 and second 1066 sets of interconnects having first and second respective potentials associated with them. The first 1065 and second 1066 sets of interconnects are preferably separated from each other with a suitable dielectric material in the regions where they overlap. In the particular embodiment depicted, each of the interconnects 1065 and 1066 is in contact with a portion of a metal capping layer 1059 in the die 1055 via a bond pad 1071. Use of a package of this type may be advantageous in applications which require the supply of different voltages to different circuits within the die 1055.

Figure 20:
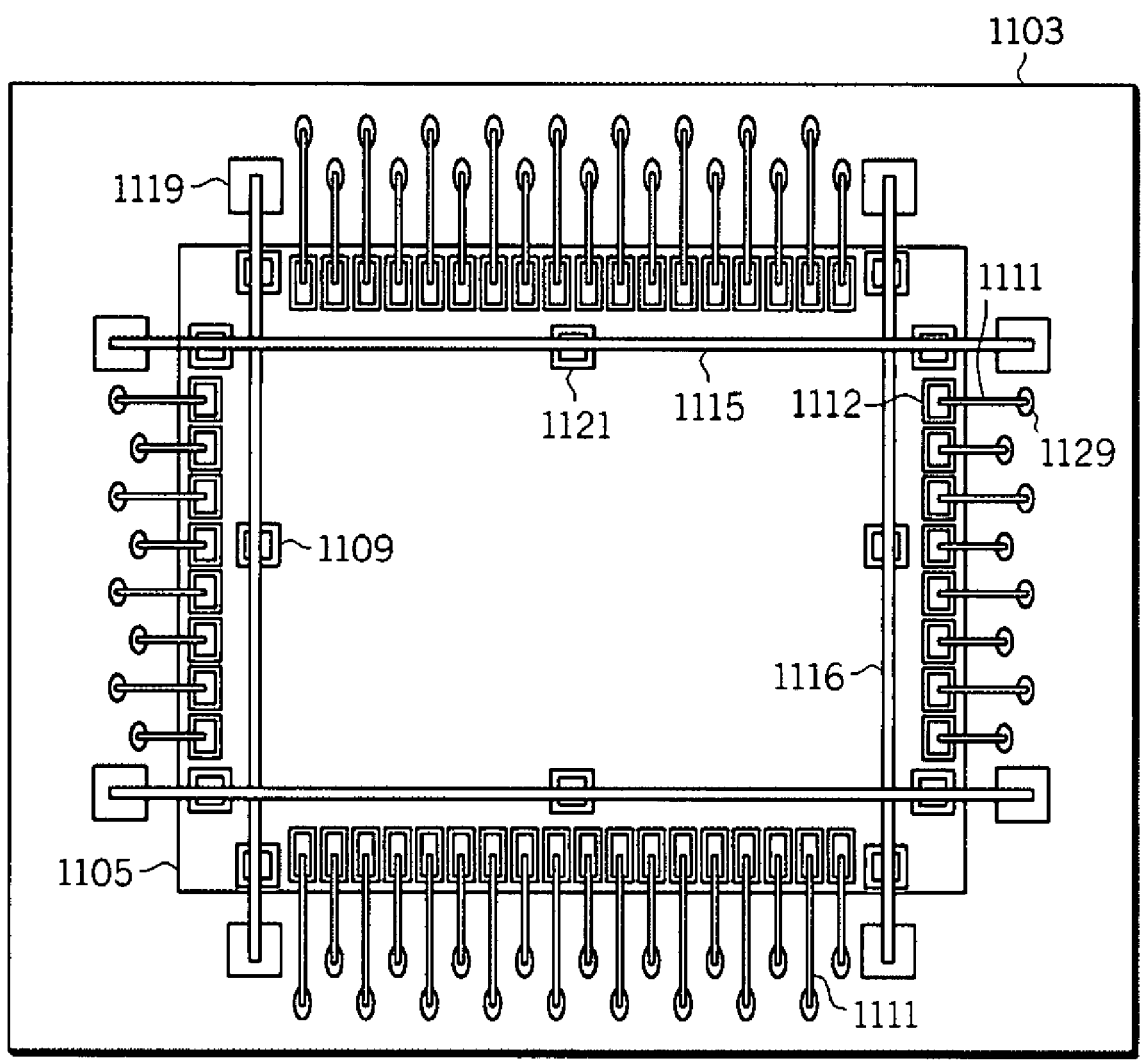
FIG. 20 is an illustration of an embodiment of an interconnect design in accordance with the teachings herein.

FIG. 20 illustrates still another particular, non-limiting embodiment of a package made in accordance with the teachings herein. The package 1101 depicted therein comprises a BGA substrate 1103 upon which is mounted a die 1105. The die 1105 is in electrical communication with the BGA substrate 1103 by way of bond wires 1111 which extend between a first set of contact pads 1112 disposed on the die 1105 and a second set of contact pads 1129 disposed on the BGA substrate 1103.

The package 1101 contains first 1115 and second 1116 sets of interconnects having first and second respective potentials associated with them. The first 1115 and second 1116 sets of interconnects are preferably separated from each other with a suitable dielectric material in the regions where they overlap. In the particular embodiment depicted, each of the interconnects 1115 and 1116 is in contact with a portion of a metal capping layer 1109 in the die 1105 via a bond pad 1121. A package of this type may be advantageous in applications that require the supply of different voltages to different circuits within the die 1105.

Various modifications may be made to the foregoing embodiments without departing from the scope of the present invention. For example, although not depicted in some of the embodiments, the spacing between the interconnects in the various embodiments described herein may be sufficient to permit a number of wire bonds and associated bonding pads to be placed between adjacent interconnects.

Moreover, while it is preferred to have each interconnect joined to the substrate on each of two terminal ends, one skilled in the art will appreciate that various embodiments may be made in accordance with the teachings herein wherein one or more of the interconnects are attached to the BGA substrate on only one end, or wherein one or more of the interconnects are attached to the BGA substrate on multiple ends or through multiple leads. It will also be appreciated that any of the interconnects in the devices described herein may be connected to a substrate (such as, for example, a BGA substrate) and a die through a single connection or through multiple connections. Moreover, any particular connection between an interconnect and the substrate or the die may be implemented as a single gull wing structure or as multiple gull wing structures.

It will also be appreciated that the interconnects described herein may take various forms. For example, in some embodiments, these interconnects may be metal strips which may be relatively rigid. In other embodiments, these interconnects may be ribbons or films which may be relatively flexible. The width of the interconnects may be as little as 50 microns, and as much as the dimensions of the chip core region. Typically, the interconnects will be sized to accommodate the power supply requirements, though the dimensions of these interconnects will not typically be a bottleneck. In some embodiments, the interconnects may comprise flexible tape.

In various embodiments described herein (such as, for example, those depicted in FIGS. 17, 19 and 20), it is desirable to electrically insulate two adjacent interconnects from each other. This may be accomplished, for example, by disposing a suitable dielectric material between the adjacent interconnects. Various dielectric materials may be utilized for this purpose. These include, without limitation, various epoxies, polyimides, and fluoropolymers (such as, for example, PTFE).

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A device, comprising:
a substrate;
a semiconductor device disposed on said substrate and having a first major surface equipped with a metal cap layer which extends over a central portion thereof;
a first group of bond pads disposed along an edge of said semiconductor device;
a first group of wire bonds which are in electrical contact with said substrate and said first group of bond pads;
a second group of bond pads disposed along an edge of said semiconductor device;
a second group of wire bonds which are in electrical contact with said substrate and said second group of bond pads; and
an interconnect which extends between said first and second groups of wire bonds and which is in electrical contact with said substrate and said metal cap layer.

2. The device of claim 1, wherein said interconnect is a metal strap.

3. The device of claim 2, wherein the metal strap is in electrical contact with said substrate and is equipped with a plurality of indentations.

4. The device of claim 3, wherein said metal strap contacts said metal cap layer via said plurality of indentations.

5. The device of claim 1, wherein the metal strap is equipped with an essentially U-shaped indentation, and wherein said interconnect contacts said metal cap layer via said indentation.

6. The device of claim 1, wherein said interconnect has a first end which is in electrical contact with said substrate, and a second end which is in electrical contact with said metal cap layer, and wherein said second end is secured to said semiconductor device by way of an electrically conductive adhesive.

7. The device of claim 1, wherein said first major surface of said semiconductor device is equipped with first and second metal cap layers.

8. The device of claim 7, wherein said semiconductor device comprises a first interconnect which is in electrical contact with said substrate and said first metal cap layer, and a second interconnect which is in electrical contact with said substrate and said second metal cap layer.

9. The device of claim 8, wherein said first metal cap layer is in electrical contact with the circuitry in the I/O ring.

10. The device of claim 8, wherein said first interconnect is in electrical contact with said substrate and is adapted to provide power to a first region of said semiconductor device, and wherein said second interconnect is in electrical contact with said substrate and is adapted to provide ground to a second region of said semiconductor device.

11. The device of claim 7, further comprising:
a first interconnect which is in electrical contact with said substrate and which is adapted to provide a first potential to a first circuit defined in said semiconductor device; and
a second interconnect which is in electrical contact with said substrate and which is adapted to provide a second potential, distinct from said first potential, to a second circuit defined in said semiconductor device.

12. The device of claim 11, wherein said first interconnect overlaps said second interconnect in a first region, and further comprising a dielectric material disposed between said first and second interconnects in said first region.

13. The device of claim 1, wherein said semiconductor device has at least one corner, and wherein said interconnect extends across said at least one corner of said semiconductor device and is in electrical contact with said substrate and said metal cap layer.

14. The device of claim 1, wherein said semiconductor device has first and second essentially perpendicular sides, and wherein said first and second groups of bond pads are disposed on said first and second sides, respectively.

15. The device of claim 14, wherein said semiconductor device has first and second interconnects which are essentially parallel and which extend between said first and second groups of bond pads.

16. The device of claim 14, wherein said semiconductor device has first, second, third and fourth sides with first, second, third and fourth groups of bond pads disposed thereon, respectively, wherein said semiconductor device has first, second, third and fourth interconnects, wherein said first and second interconnects are essentially parallel, and wherein said first and second interconnects extend between said first and second groups of bond pads, and further extend between said third and fourth groups of bond pads.

17. The device of claim 16, wherein said third and fourth interconnects are essentially parallel and extend between said third and fourth groups of bond pads, and wherein said third and fourth interconnects extend between said first and third groups of bond pads, and further extend between said second and fourth groups of bond pads.

18. The device of claim 1, wherein said semiconductor device has first and second corners, and wherein said semiconductor device has first and second interconnects which extend, respectively, across said first and second corners.

19. The device of claim 18, wherein each of said first and second interconnects are in electrical contact with said substrate and said metal cap layer.

20. The device of claim 18, wherein said semiconductor device has first, second, third and fourth corners, wherein said first interconnect extends across said first and second corners, wherein said second interconnect extends across said third and fourth corners, and wherein said first and second interconnects intersect over the surface of the semiconductor device.

* * * * *